United States Patent
Kushihashi et al.

(10) Patent No.: US 7,329,842 B2
(45) Date of Patent: Feb. 12, 2008

(54) CERAMIC HEATER AND METHOD FOR PRODUCING CERAMIC HEATER

(75) Inventors: Takuma Kushihashi, Gunma (JP); Noboru Kimura, Gunma (JP); Masaki Seki, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/590,812

(22) Filed: Nov. 1, 2006

(65) Prior Publication Data

US 2007/0102419 A1   May 10, 2007

(30) Foreign Application Priority Data

Nov. 8, 2005   (JP)   ............... 2005-323967

(51) Int. Cl.
*H05B 3/06*   (2006.01)

(52) U.S. Cl. .............. 219/520; 219/444.1; 219/548; 219/552; 219/553

(58) Field of Classification Search ........... 219/520, 219/444.1, 541, 544, 548, 552, 553, 538
See application file for complete search history.

(56) References Cited

U.S. PATENT DOCUMENTS 5,343,022 A * 8/1994 Gilbert et al. .............. 219/552

2004/0074899 A1 * 4/2004 Mariner et al. ............. 219/553

FOREIGN PATENT DOCUMENTS

| JP | B 2702609 | 10/1997 |
| JP | B 3560456 | 6/2004 |
| JP | A 2004-220966 | 8/2004 |
| JP | A 2004-253799 | 9/2004 |
| WO | WO 94/08436 | 4/1994 |

* cited by examiner

*Primary Examiner*—Tu Ba Hoang
*Assistant Examiner*—Leonid Fastovsky
(74) *Attorney, Agent, or Firm*—Oliff & Berridge PLC

(57) ABSTRACT

A ceramic heater including a plate member made of insulating ceramics in which one or more pair(s) of through-holes are formed, a rod member made of conductive ceramics with a power-supply terminal at one end. The rod member is inserted into the through hole in the plate member. A conductive layer made of conductive ceramics is formed on the plate member; and a coating layer made of insulating ceramics is formed on the conductive layer. One end face of the rod member has a same plane with a main surface of the plate member, the conductive layer has a heater pattern formed on the main surface of the plate member, and the rod members are electrically insulated not to be short-circuited to each other in the opposite main surface.

20 Claims, 3 Drawing Sheets

CERAMIC HEATER AND METHOD FOR PRODUCING CERAMIC HEATER

BACKGROUND OF THE INVENTION

1. Field of the Invention

The present invention relates to, a ceramic heater used for heating a semiconductor wafer in semiconductor production process or for heating a substrate when a thin film is formed according to chemical vapor deposition method or sputtering method, and a method for producing the ceramic heater.

2. Description of the Related Art

As a ceramic heater used for heating a semiconductor wafer in semiconductor production process or for heating a substrate when a thin film is formed according to chemical vapor deposition method or sputtering method, there has been used a heater having a structure in which a heating element consisting of metal foil or rolled circuit or a heating element formed by screen-printing a conductive paste containing metal particles or conductive ceramic particles is buried in a supporting substrate made of sintered body such as silicon nitride, aluminum nitride, or boron nitride (see, Japanese Patent Laid-open (Kokai) No. 2004-220966; and Japanese Patent Laid-open (Kokai) No. 2004-253799).

However, in the case of forming a heater pattern by screen-printing, film-thickness of the heating element easily becomes non uniform, and therefore, occasionally, the heater does not have good heating uniformity. Moreover, there is possibility that organic matter contained in paste used for screen-printing or component of a sintering auxiliary agent contained in a ceramic sintered body becomes a source origin of impurity.

On the other hand, if a conductive layer made of pyrolytic graphite is made by chemical vapor deposition method on a supporting substrate made of pyrolytic boron nitride generated by chemical vapor deposition method and a desired heater pattern is formed by machining therein and furthermore the heater pattern is coated with a coating layer made of pyrolytic boron nitride according to chemical vapor deposition method, a conductive layer having a uniform film-thickness can be easily obtained and a ceramic heater having good heating uniformity can be provided (see, Japanese Patent No. 3560456).

Moreover, because all of the supporting substrate, the conductive layer, and the coating layer, are produced by chemical vapor deposition method, they have higher purity than ones produced by sintering method and have an advantage of a semiconductor wafer being difficult to be contaminated with impurities and are advantageous in heating process.

In the heater in which a conductive layer made of pyrolytic graphite is made by chemical vapor deposition method on a supporting substrate made of pyrolytic boron nitride generated by chemical vapor deposition method and a desired heater pattern is formed by machining therein and furthermore the heater pattern is coated with a coating layer made of pyrolytic boron nitride according to chemical vapor deposition method, through-holes are provided on both ends of the heater pattern and the coating layer at periphery of the through-hole is removed to expose the conductive layer, and a conductive wire from a power source is fixed to the exposed part of the conductive layer by a bolt and a nut that are made of metal or carbon material such as graphite, carbon, or carbon complex material, and thereby the heater is connected to the power source.

However, according to the above connection method, the conductive layer being exposed at the part connected to the power source is wasted and causes abnormal heat generation, and if it is more wasted, electric discharge is caused and the heater becomes damaged. Therefore, there is a problem that use conditions of the heater (heating temperature, atmosphere) are limited. Moreover, in the case that a bolt and a nut that are made of graphite, carbon, carbon complex material, or the like, are used, they become a source origin of particles. Moreover, in the case that a bolt and a nut that are made of metal, particles are difficult to be generated in some time period from an initiation of use, compared to the case that a bolt and a nut that are made of graphite, carbon, carbon complex material, or the like. However, if they continue to be used for a long period, they are degraded with heat even if they are a bolt and a nut made of metal. Ultimately, there is a problem that they become source origins of particles. Also, there is a risk of causing metal contamination of a semiconductor wafer to be treated.

For solving these problems, a ceramic heater described in Japanese Patent No. 2702609 can be exemplified. This is a ceramic heater having a structure in which a heater main body is provided with a heater pattern made of pyrolytic graphite in a substrate made of pyrolytic boron nitride and through-holes are provided in contact ends located in the both ends of the heater pattern and graphite rod members having a predetermined length are fixed through the through-holes using graphite screws so as to be located in the face opposite to the heater patter and then the heater main body and the graphite screws and graphite rod members are integrally coated with a coating layer made of pyrolytic boron nitride.

And, for strengthening mechanically and electrically the attachment of the graphite screws and the graphite rod members, flexible graphite washers are placed between the graphite screw and the heater main body and between the heater main body and the graphite rod member. At the other end of the graphite rod member opposite to the end fixed to the heater main body by the graphite screw, the coating layer made of pyrolytic boron nitride is not formed and a conductive wire is connected to this part.

In the heater described in Japanese Patent No. 2702609, the conductive layer made of pyrolytic graphite to form the heater pattern, the graphite screws, and the members made of carbon material such as graphite rod members are almost entirely coated with a coating layer made of pyrolytic boron nitride. Therefore, it becomes a heater available even in an atmosphere having reactivity with carbon, and generation of particles from the graphite screws, the graphite rod members, or the like, can be suppressed.

In the other end of the graphite rod member opposite to the end fixed to the heater main body by the graphite screw, the coating layer made of pyrolytic boron nitride is not formed and a conductive wire is connected to this part. However, because this part is apart from the heater pattern by the distance of the length of the graphite rod member having the predetermined length, temperature thereof is suppressed to be low. Accordingly, if the heater is used in an atmosphere having reactivity with carbon, degradation thereof is small to some extent. Moreover, if the screw made of metal is used for the connection of the conductive wire, the metal screw hardly becomes a source origin of particles by degradation with heat because the temperature is low.

Here, as main methods for heating a semiconductor wafer with a ceramic heater, there are a method for heating the semiconductor wafer with radiant light from the heater without contact between the wafer and the heater, and a method for heating the semiconductor wafer by heat conduction with putting directly the wafer on the heater.

In the case of performing the radiant heating under a reduced pressure, as use time thereof becomes longer, the heater surface is contaminated by film adhesion due to wrap-around of process gas or by adhesion of scattered things from the peripheral members. Therefore, radiation rate is changed and it occasionally become impossible that a semiconductor wafer is heated in the same manner even with the same electric power. Such a phenomenon is particularly significant in a high-temperature process of 1000° C. or more.

In the case of the heating by directly putting, there are not such problems. Moreover, the heating by directly putting is better in heating efficiency than the radiant heating. Therefore, the heating by directly putting is more appropriate in cost in a high-temperature process.

In the heater described in Japanese Patent No. 2702609, the head of the graphite screw for fixing the graphite rod member sticks out of the heating surface of the heater. Therefore, in the case of putting directly an object to be heated on the heater and heating it, positions in which graphite rod members are provided have to be necessarily outside the region on the heater on which an object to be heated is put. Therefore, there is a problem that the heater becomes large in size.

Moreover, as diameter of a semiconductor wafer has become enlarged in recent years, a large heater has become used as a heater for heating such a wafer. However, in order that current value and power voltage value are made not to be too large or that temperature distribution of the semiconductor wafer is made to be improved, there is frequently used a heater having a two-zone system in which a first heating region in the vicinity of the heater center to be heated by a first power source and a second heating region in the outside thereof to be heated by a second power source are provided and the heater is heated by two power sources.

In the case that a semiconductor wafer is directly put and heated on the heater having a two-zone system in the heater having the structure described in Japanese Patent No. 2702609, the head of the graphite screw sticks out of the heating surface of the heater with regard to the shape of the first heating region and the second heating region of the heater. Therefore, there is no other choice but the shape is made to be one shown in FIG. 6.

The semiconductor wafer is put on the region inside the dashed line 1 in FIG. 6. The heater center is the first heating region 2 and the outside thereof is the second heating region 3. Graphite rod members 4 connected to the first heating region 2 and graphite rod members 5 connected to the second heating region 3 are respectively provided in the most peripheral part of the heater. That is, because the graphite rod members 4 connected to the first heating region 2 located in the vicinity of the heater center are provided in the most peripheral part of the heater, the conductive pathways 6 connecting the first heating region 2 and the graphite rod members 4 have to be provided in the second heating region 3.

Therefore, in the second heating region 3 to be heated by the second power source, there is a heating element to be heated by the first power source. Depending on electric power balance of the first power source and the second power source, the conductive pathway 6 becomes a local heating part or a local low-temperature part. Therefore, there is a problem that temperature distribution of the wafer is adversely affected thereby.

Moreover, the graphite rod members are fixed in a shape of putting the heater main body therebetween through graphite screws. However, a coefficient of linear expansion of graphite is generally $3\text{-}7\times10^{-6}$, and on the other hand, a coefficient of linear expansion in the thickness direction of pyrolytic boron nitride, which is the substrate, is $5\text{-}8\times10^{-5}$. Therefore, stress due to thermal expansion of pyrolytic boron nitride, which is the substrate, acts on the graphite screws or the graphite rod members at each time when temperature of the heater is raised.

Therefore, in the case that the graphite screws and the graphite rod members have small diameters, there is a problem that the head of the graphite screw is damaged or ridge parts of the graphite screw and the graphite rod member are broken down, and therefore, the graphite screw and the conductive layer come to have poor connection and it is feared that the heater comes not to be heated.

If the graphite screw and the graphite rod member have large diameters, damage in the head of the graphite screw or poor connection due to breaking down of the screw can be prevented. However, there is a problem that because cross-section area of the graphite screw or the graphite rod member becomes large, amount of heat to outflow to the outside becomes large and it becomes difficult to heat uniformly an object to be heated.

SUMMARY OF THE INVENTION

The present invention has been accomplished to solve the above-mentioned problems, and a main object of the present invention is to provide a ceramic heater by which an object to be heated being directly put thereon can be heated uniformly and of which heating efficiency is high and in which the heater main body is not large in size and is compact, and a method for producing the ceramic heater.

To achieve the above object, the present invention provides a ceramic heater comprising: at least a plate member made of insulating ceramics in which one or more pair(s) of through-holes are formed;

a rod member, being made of conductive ceramics, having a power-supply terminal at one end thereof, and being inserted into the through-hole of the plate member at another end thereof;

a conductive layer made of conductive ceramics formed on the plate member; and a coating layer made of insulating ceramics formed on the conductive layer;

wherein one end face opposite to a side having the power-supply terminal of the rod member has a same plane with a main surface of the plate member;

the conductive layer having a heater pattern is formed on the main surface of the plate member having the same plane; and the rod members are electrically insulated not to be short-circuited to each other in a main surface of the plate member opposite to a side on which the heater pattern is formed.

When one end face of the rod member has a same plane with a main surface of the plate member and the conductive layer having a heater pattern is formed on the main surface of the plate member having the same plane, it is not necessary that the positions in which the rod members are provided are made to be outside the region on the plate member on which an object to be heated is put. Therefore, the heater main body does not become large in size and has a compact structure. The ceramic heater can heat uniformly an object to be heated being put directly on the flat heater with high heating efficiency.

In the above case, it is preferable that the rod member is pressed-fit into the through-hole of the plate member and fixed to the plate member by being coated with the conductive layer and the coating layer.

When the rod member is pressed-fit into the through-hole of the plate member and fixed to the plate member by being coated with the conductive layer and the coating layer, screw to be the cause of a trouble such as breaking is not used for connecting the-plate member and the rod member. Therefore, the contact of the conductive layer and the rod member is good and durability thereof becomes high and also cross-section area of the rod member can become small. As a result, amount of heat to outflow to the outside can be suppressed to small and the object to be heated can be heated uniformly with higher heating efficiency. Moreover, it is not necessary to use a bolt and a nut to be source origins of particles, and therefore there is no scattering of impurities and therefore the heater is applicable to heating process in which high purity is required.

Moreover, it is preferable that the plate member is made of any one of pyrolytic boron nitride, pyrolytic boron nitride containing carbon, pyrolytic boron nitride containing silicon, and pyrolytic boron nitride containing aluminum.

When the plate member is made of any one of pyrolytic boron nitride and pyrolytic boron nitride containing carbon and pyrolytic boron nitride containing silicon and pyrolytic boron nitride containing aluminum, the plate member can be produced by chemical vapor deposition method and can be stably used at a high temperature, and therefore there is no scattering of impurities and therefore the heater is applicable to heating process in which high purity is required.

Here, in the case that the plate member is made of pyrolytic boron nitride containing carbon or pyrolytic boron nitride containing silicon or pyrolytic boron nitride containing aluminum, resistivity of the plate member becomes smaller as the carbon content or the silicon content or the aluminum content becomes larger. It is necessary that the carbon content or the silicon content or the aluminum content is suppressed to amount by which insulation can be held at gaps of the heater pattern.

Furthermore, it is preferable that the rod member is made of any one of graphite, sintered silicon carbide, and sintered boron carbide.

When the rod member is made of any one of graphite and sintered silicon carbide and sintered boron carbide, the rod member becomes excellent in heat resistance and the outer face thereof are coated with the conductive layer and the coating layer, and therefore, there is no scattering of impurities and therefore the heater is applicable to heating process in which high purity is required. In particular, graphite is more preferable because it is relatively low in price and easy to be processed.

Moreover, it is preferable that the conductive layer is made of any one of pyrolytic graphite and pyrolytic graphite containing boron and/or boron carbide.

When the conductive layer is made of any one of pyrolytic graphite and pyrolytic graphite containing boron and/or boron carbide, the conductive layer is easier to be processed than metal foil or rolled circuit and therefore it becomes easy that as the heater pattern having meandering pattern, width and thickness thereof are changed and thereby to make a discretionary temperature gradient therein or to make a heating distribution therein according to the heat environment to uniform heat. Furthermore, if chemical vapor deposition method is used, the thickness of the conductive layer can be more uniform, compared to a method of coating a conductive paste by screen-printing.

Furthermore, it is preferable that the coating layer is made of any one of pyrolytic boron nitride, pyrolytic boron nitride containing carbon, pyrolytic boron nitride containing silicon, and pyrolytic boron nitride containing aluminum.

When the coating layer is made of any one of pyrolytic boron nitride and pyrolytic boron nitride containing carbon and pyrolytic boron nitride containing silicon and pyrolytic boron nitride containing aluminum, there are no delamination and no scattering of impurities due to use at a high temperature, and therefore, the coating layer becomes applicable to heating process in which high purity is required.

Here, in the case that the coating layer is made of pyrolytic boron nitride containing carbon or pyrolytic boron nitride containing silicon or pyrolytic boron nitride containing aluminum, resistivity of the coating layer becomes smaller as the carbon content or the silicon content or the aluminum content becomes larger. It is necessary that the carbon content or the silicon content or the aluminum content is suppressed to amount by which insulation can be held at gaps of the heater pattern or between the heater pattern and the object to be heated.

Moreover, the present invention provides a method for producing a ceramic heater, comprising at least steps of:

forming one or more pair(s) of through-holes in a plate member made of insulating ceramics;

forming a power-supply terminal at one end of a rod member made of conductive ceramics and inserting another end thereof into the through-hole of the plate member; then forming a conductive layer made of conductive ceramics on the plate member; and then forming a coating layer made of insulating ceramics on the conductive layer;

wherein the rod member is inserted into the through-hole of the plate member so that one end face opposite to a side having the power-supply terminal of the rod member has a same plane with a main surface of the plate member; then the conductive layer is formed so that the rod member and the plate member are integrally coated, and thereby to fix firmly the rod member and the plate member;

a heater pattern is formed by processing the conductive layer on the main surface of the plate member having the same plane;

the conductive layer on a main surface of the plate member opposite to the main surface on which the heater pattern is formed is partially or totally removed, and thereby to insulate electrically the rod members not to be short-circuited to each other; and then the coating layer is formed so that the plate member, the rod member, and the conductive layer, are integrally coated.

By inserting the rod member into the through-hole of the plate member so that one end face of the rod member has a same plane with a main surface of the plate member, it is not necessary that the positions in which the rod members are provided are made to be outside the region on the plate member on which an object to be heated is put. Therefore, there can be produced a ceramic heater in which the heater main body does not become large in size and has a compact structure and an object to be heated being put directly on the flat heater can be heated uniformly with high heating efficiency.

Moreover, by forming the conductive layer so that the rod member and the plate member are integrally coated, the rod member and the plate member can be firmly fixed. In particular, by chemically vapor-depositing a conductive ceramic material on the whole of the rod member and the plate member, the rod member and the plate member can be firmly fixed easily and it is not necessary to use screw and such.

Furthermore, the heater pattern is formed by processing the conductive layer on the main surface of the plate member having the same plane and the conductive layer on the opposite main surface of the plate member is partially or totally removed and thereby to insulate electrically the rod members not to be short-circuited to each other, and thereby there can be easily produced a heater by which heating can be performed uniformly with high heating efficiency.

Moreover, by forming the coating layer so that the plate member and the rod member and the conductive layer are integrally coated, the rod member and the plate member can be easily fixed, for example, along with forming the coating layer by chemical vapor deposition method.

In the above case, it is preferable that the rod member is inserted into the through-hole of the plate member by press-fit.

When the rod member is inserted into the through-hole of the plate member by press-fit, screw is not used for connecting the plate member and the rod member, and the contact of the conductive layer and the rod member can be good and cross-section area of the rod member can be small. Therefore, amount of heat to outflow to the outside can be suppressed to small and the object to be heated can be heated uniformly with higher heating efficiency. In this case, it is preferable that one end face of the rod member and the main surface of the plate member have an accurately same plane, and then flat-surface processing is performed by flat-surface grinding of the main surface, or the like.

Moreover, it is preferable that as the plate member, any one of, pyrolytic boron nitride, pyrolytic boron nitride containing carbon, pyrolytic boron nitride containing silicon, and pyrolytic boron nitride containing aluminum, is used.

When any one of pyrolytic boron nitride and pyrolytic boron nitride containing carbon and pyrolytic boron nitride containing silicon and pyrolytic boron nitride containing aluminum is used as the plate member, the plate member can be produced by chemical vapor deposition method and there is no scattering of impurities due to use at a high temperature, and therefore, there can be produced a heater being also applicable to heating process in which high purity is required.

Here, in the case that the plate member is made of pyrolytic boron nitride containing carbon or pyrolytic boron nitride containing silicon or pyrolytic boron nitride containing aluminum, resistivity of the plate member becomes smaller as the carbon content or the silicon content or the aluminum content becomes larger. It is necessary that the carbon content or the silicon content or the aluminum content is suppressed to amount by which insulation can be held at gaps of the heater pattern.

Furthermore, it is preferable that as the rod member, any one of, graphite, sintered silicon carbide, and sintered boron carbide, is used.

When any one of graphite and sintered silicon carbide and sintered boron carbide is used as the rod member, heat resistance thereof is excellence, and additionally, because the conductive layer and the coating layer are coated on the outer surface thereof, there is no scattering of impurities, and therefore, the heater is applicable to heating process in which high purity is required.

Moreover, it is preferable that the conductive layer is formed by chemically vapor-depositing any one of pyrolytic graphite and pyrolytic graphite containing boron and/or boron carbide.

When the conductive layer is formed by chemically vapor-depositing any one of pyrolytic graphite and pyrolytic graphite containing boron and/or boron carbide, the conductive layer is easier to be processed than metal foil or rolled circuit and therefore it becomes easy that as the heater pattern having meandering pattern, width and thickness thereof are changed and thereby to make a discretionary temperature gradient therein or to make a heating distribution therein according to the heat environment to uniform heat.

Furthermore, it is preferable that the coating layer is formed by chemically vapor-depositing any one of pyrolytic boron nitride, pyrolytic boron nitride containing carbon, pyrolytic boron nitride containing silicon, and pyrolytic boron nitride containing aluminum.

When the coating layer is formed by chemically vapor-depositing any one of pyrolytic boron nitride and pyrolytic boron nitride containing carbon and pyrolytic boron nitride containing silicon and pyrolytic boron nitride containing aluminum, there are no delamination and no scattering of impurities due to use at a high temperature, and therefore, the coating layer becomes applicable to heating process in which high purity is required.

Here, in the case that the coating layer is made of pyrolytic boron nitride containing carbon or pyrolytic boron nitride containing silicon or pyrolytic boron nitride containing aluminum, resistivity of the coating layer becomes smaller as the carbon content or the silicon content or the aluminum content becomes larger. It is necessary that the carbon content or the silicon content or the aluminum content is suppressed to amount by which insulation can be held at gaps of the heater pattern or between the heater pattern and the object to be heated.

As described above, it becomes possible by the present invention that the heater main body is not large in size and has a compact structure, and that an object to be heated being put directly on the flat heater can be heated uniformly with high heating efficiency, and that there is no scattering of impurities in heating and the heater becomes also applicable to heating process in which high purity is required.

Furthermore, because it is not necessary that screw to be the cause of a trouble such as breaking is used for connecting the plate member and the rod member, the contact of the conductive layer and the rod member is good and also endurance thereof is also high and also cross-section area of the rod member can become small, and therefore, the object to be heated can be heated uniformly with higher heating efficiency.

DETAILED DESCRIPTION OF THE PREFERRED EMBODIMENTS

Conventionally, in the case of producing a heater having high durability which causes no scattering of impurities in heating and which is applicable to heating process in which high purity is required, positions in which graphite rod members are provided by screws have to be outside the region on the heater on which an object to be heated is put. Therefore, the heater becomes large in size. Moreover, if a thin graphite rod member is used, the graphite screw fixed to the supporting member fails to be in contact with the conductive layer, and if a thick graphite rod member is used, there is a problem that it becomes difficult to heat uniformly an object to be heated.

Then, the present inventors have investigated thoroughly. They have found that by the following ceramic heater, an object to be heated being directly put on a flat heater can be heated uniformly and heating efficiency thereof is high and the heater main body is not large in size and is compact.

The present invention provides a ceramic heater comprising: at least a plate member made of insulating ceramics in which one or more pair(s) of through-holes are formed;

a rod member, being made of conductive ceramics, having a power-supply terminal at one end thereof, and being inserted into the through-hole of the plate member at another end thereof;

a conductive layer made of conductive ceramics formed on the plate member; and a coating layer made of insulating ceramics formed on the conductive layer;

wherein one end face opposite to a side having the power-supply terminal of the rod member has a same plane with a main surface of the plate member;

the conductive layer having a heater pattern is formed on the main surface of the plate member having the same plane; and the rod members are electrically insulated not to be short-circuited to each other in a main surface of the plate member opposite to a side on which the heater pattern is formed.

Furthermore, in the above case, it has been found that when the rod member is pressed-fit into the through-hole of the plate member and fixed to the plate member by being coated with the conductive layer and the coating layer, screw to be the cause of a trouble such as breaking is not used for connecting the plate member and the rod member. Therefore, cross-section area of the rod member can be small along with the contact of the conductive layer and the rod member being good. Therefore, the object to be heated can be heated uniformly with higher heating efficiency.

Hereinafter, an embodiment according to the present invention will be described in detail with reference to the appended drawings. However, the present invention is not limited thereto.

Figure 1:
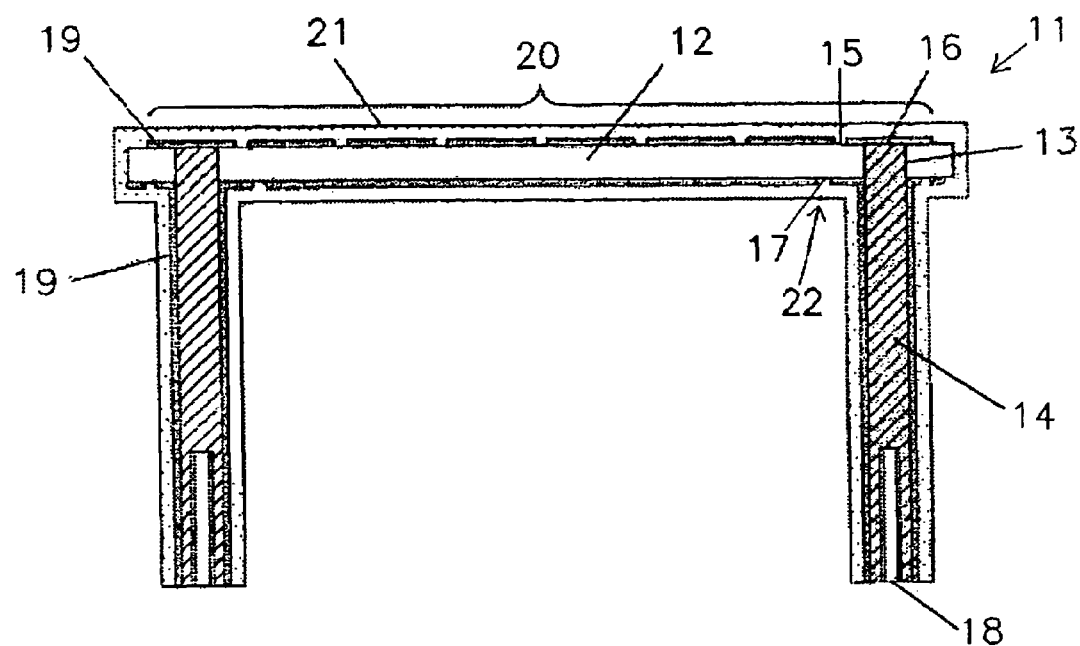
FIG. 1 is a cross-section view showing an example of a ceramic heater of the present invention.
Figure 2:
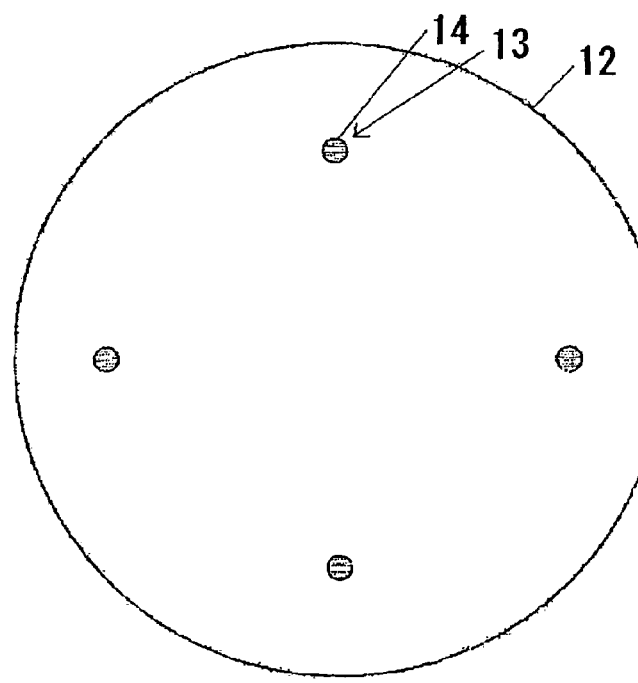
FIG. 2 is a plan view showing an example of a plate member and a rod member in the ceramic heater of the present invention.
Figure 3:
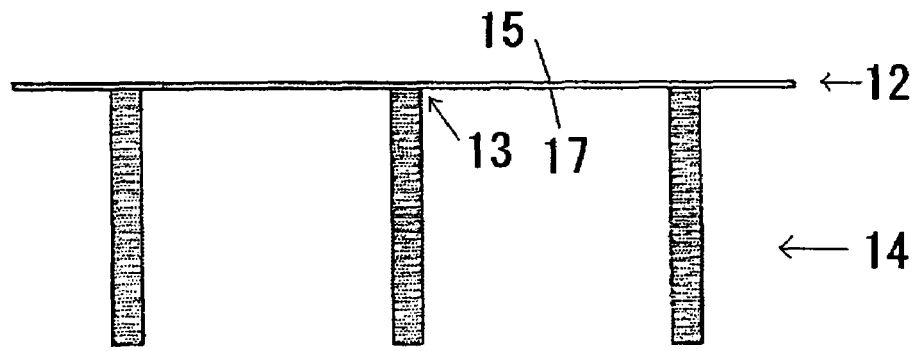
FIG. 3 is a side view showing an example of a plate member and a rod member in the ceramic heater of the present invention.

FIG. 1 is a view showing an example of a ceramic heater of the present invention. FIG. 2 and 3 show an example of a plate member and a rod member in the ceramic heater of the present invention.

The present invention provides a ceramic heater 11 comprising: at least a plate member 12 made of insulating ceramics in which one or more pair(s) of through-holes 13 are formed;

a rod member 14, being made of conductive ceramics, having a power-supply terminal 18 at one end thereof, and being inserted into the through-hole 13 of the plate member 12 at another end thereof;

a conductive layer 19 made of conductive ceramics formed on the plate member 12; and a coating layer 21 made of insulating ceramics formed on the conductive layer;

wherein one end face 16 opposite to a side having the power-supply terminal 18 of the rod member 14 has a same plane with a main surface 15 of the plate member;

the conductive layer 19 having a heater pattern 20 is formed on the main surface 15 of the plate member having the same plane; and the rod members 14 are electrically insulated not to be short-circuited to each other in a main surface 17 of the plate member 12 opposite to a side on which the heater pattern 20 is formed.

When one end face 16 of the rod member has a same plane with a main surface 15 of the plate member and the conductive layer 19 having a heater pattern 20 is formed on the main surface 15 of the plate member having the same plane, it is not necessary that the positions in which the rod members 14 are provided are made to be outside the region on which an object to be heated is put on the plate member 12, and the rod members can be provided at discretionary positions inside the region. The ceramic heater can be smaller in size than a conventional one and the heater can be flat without sticking-out thing on the heating surface of the heater.

In addition, by the heater pattern formed on the same plane, the ceramic heater can heat uniformly an object to be heated being put directly on the flat heater with high heating efficiency. Additionally, in FIG. 1, for achieving better heating uniformity, a heater pattern 20 is also formed on one end face 16 of the rod member 14.

In the above case, the rod members 14 are electrically insulated not to be short-circuited to each other in a main surface 17 of the plate member 12 opposite to a side on which the heater pattern is formed. For insulating electrically as described above, the conductive layer on the opposite surface may be partially or totally removed. In FIG. 1, the conductive layer is partially removed by forming a groove 22.

Figure 6:
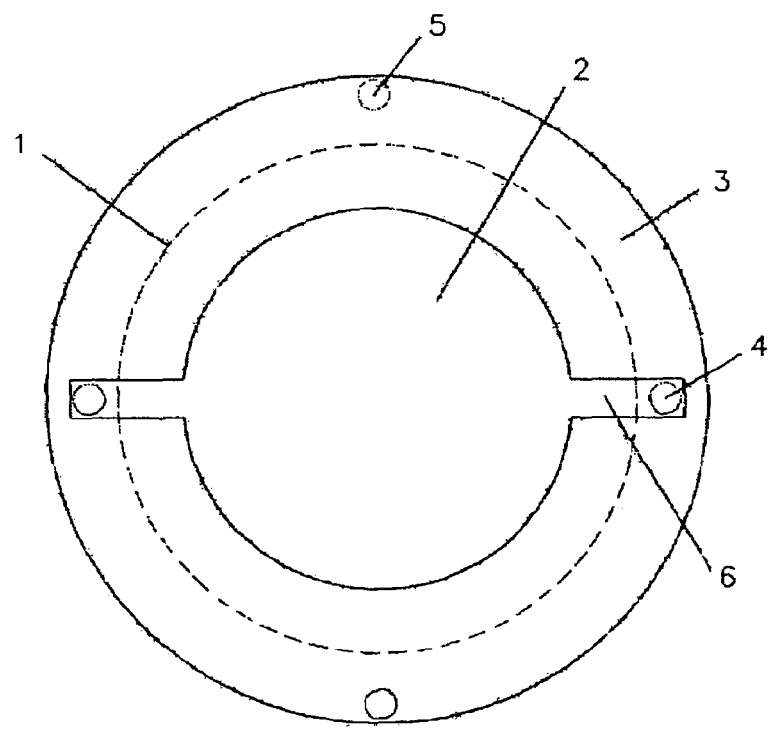
FIG. 6 is a plan view showing an example of a zone division of a ceramic heater having two-zone system according to a conventional technique.

Furthermore, in the case that the ceramic heater according to the present invention has two-zone system, the heater is difficult from a conventional heater as shown in FIG. 6, and the rod members 14 to be connected to the first heating region 2 can be provided in the first heating region 2. Therefore, it is not necessary that the conductive pathways connecting the first heating region 2 and the rod members 14 are provided in the second heating region 3. Therefore, in the case of two-zone system, it is possible that the ceramic heater can have better heating uniformity (see, FIG. 4).

Here, it is sufficient that the plate member 12 is made of insulating ceramics in which one or more pair(s) of through-holes 13 are formed and functions as a supporting substrate in which a heater pattern 20 is formed. However, it is preferable that the plate member is made of any one of pyrolytic boron nitride, pyrolytic boron nitride containing carbon, pyrolytic boron nitride containing silicon, and pyrolytic boron nitride containing aluminum.

In the above case, the plate member 12 can be produced by chemical vapor deposition method and has a high insulating property and there is no scattering of impurities due to use at a high temperature, and therefore is applicable to heating process in which high purity is required. In particular, it can be also used stably in a high-temperature process at about 1500° C. and additionally at a rapidly rising or falling temperature of 100° C./min or more. It is preferable that thickness of the plate member 12 is 1-5 mm, and more preferably, 2-4 mm. In the case that the thickness of the plate member 12 is thinner than 1 mm, bow is occasionally caused. In the case of 5 mm or thicker, the difference between thermal expansion amount in the thickness direction of the plate member 12 and thermal expansion amount of the rod member 14 becomes large, and at the press-fit part, crack or delamination is occasionally generated in the conductive layer 19 made of conductive ceramics or the coating layer 21.

Figure 4:
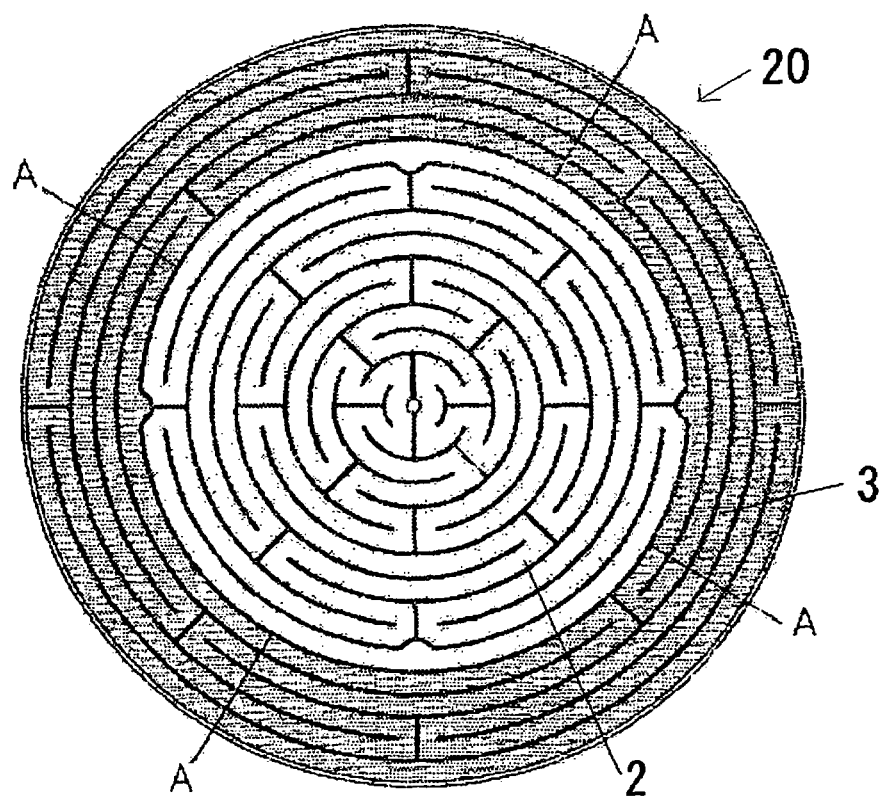
FIG. 4 is a plan view showing an example of a heater pattern in the ceramic heater of the present invention.

In addition, it is preferable that the shape of the plate member 12 is a disc-like shape as FIG. 2 or 4 for supporting a semiconductor wafer having a circular shape with a large diameter as an object to be heated, it may be a polygonal plate shape according to need. Moreover, the through-holes 13 are formed by one or more pair(s). However, for example, in the case of the heater having a two-zone system, two pairs are formed as FIG. 2, 3. The shape of the through-hole 13 is not particularly limited as long as that is a shape being capable of inserting and fixing the rod member 14 therein. However, it is preferable that it is a circular shape being capable of pressing-fit and fixing a cylindrical rod member 14 thereinto.

Moreover, the rod member 14 has a power-supply terminal 18 to be supplied with power source at one end thereof and is inserted into the through-hole 13 of the plate member 12 at another end thereof and is made of conductive ceramics, and one end face 16 opposite to a side having the power-supply terminal 18 has a same plane with a main surface 15 of the plate member.

Therefore, it is not necessary that the positions in which the rod members are provided are made to be outside the region on the plate member on which an object to be heated is put. Therefore, the heater main body does not become large in size and has a compact structure. And, there can be produced a heater being capable of heating uniformly an object to be heated being put directly on the flat heater with high heating efficiency by the heater pattern to be formed on the same plane.

Figure 5:
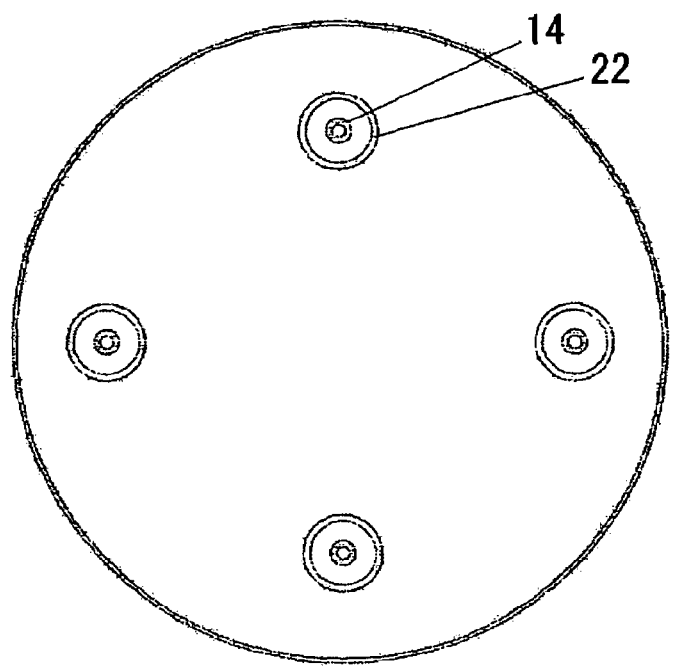
FIG. 5 is a plan view showing an example of a back side in the ceramic heater of the present invention.

As FIG. 1-3, the rod members 14 are inserted into one or more pair(s) of through-holes 13. In the opposite main surface (rear surface) 17 of the plate member, the rod members 14 are electrically insulated not to be short-circuited to each other. For example, as shown in FIG. 5 and FIG. 1, by providing a removal part 22 of the conductive layer in the rear surface of the heater, the electrical insulating can be performed.

Furthermore, the rod member 14 is pressed-fit into the through-hole 13 of the plate member 12 and fixed by being coated with the conductive layer 19 and the coating layer 21. For example, this can be formed by pressing-fit the rod members 14 into the plate member 12 and then performing flat-surface processing by subjecting the main surface 15 of the plate member and the one end face 16 to flat-surface grinding or the like so that the end face has the same plane with the main surface 15. By fixing this with the conductive layer and the coating layer, this has a structure being fixed without using screw for connecting the plate member and the rod member. Therefore, a trouble that head of screw is damaged cannot be caused, and also it is not possible that ridge parts of the graphite screw and the graphite rod member are broken down and therefore the graphite screw and the conductive layer come to have poor connection like a conventional technique. Therefore, the ceramic heater can hold good connection between the conductive layer and the rod member for a long time and be used stably.

Furthermore, because it is not necessary that, the rod member 14 made of conductive ceramics is made to be thick for an object of preventing the trouble in the screw ridges as a conventional technique, cross-section area of the rod member 14 can be small. Therefore, amount of heat to outflow to the outside can be suppressed to small and the object to be heated can be heated uniformly with higher heating efficiency. In addition, it is not necessary that a bolt and a nut to be origin sources of particles, and therefore there is no scattering of impurities and therefore the heater is applicable to heating process in which high purity is required.

Moreover, it is preferable that the rod member 14 is made of any one of graphite, sintered silicon carbide, and sintered boron carbide. Thereby, the rod member becomes excellent in heat resistance and additionally the outer face thereof are coated with the conductive layer and the coating layer, and therefore, there is no scattering of impurities and therefore the heater is applicable to heating process in which high purity is required. In particular, graphite is more preferable because it is relatively low in price and easy to be processed.

It is preferable that a shape of the rod member 14 is a cylindrical shape as shown in FIG. 1 or 3. However, the shape is not limited thereto and may be a shape being capable of being inserted and fixed to the through-hole 13. Diameter of the rod member 14 is not particularly limited. However, it may be a diameter of 3-20 mm and more preferably 8-14 mm. If the diameter is smaller than 3 mm, the rod member occasionally breaks. If the diameter is larger than 20 mm, outflow of heat to the outside from the rod member 14 is large and temperature distribution of the heater occasionally becomes large.

Moreover, the conductive layer 19 is made of conductive ceramics and has a heater pattern 20 on the main surface 15 of the plate member having the same plane made by the other end face 16 opposite to the side having the power-supply terminal 18 of the rod member 14. In this case, the heater pattern can also be formed on the surface 16 of the rod member as described above, and by such a heater pattern 20, an object to be heated can be heated uniformly with high heating efficiency.

Furthermore, together with the coating layer 21, the conductive layer 19 coats and fixes the plate member 12 and the rod member 14 pressed-fit into the through-hole 13 therein. Thereby, the rod member 14 and the plate member 12 can be firmly fixed, and the electrical contact of the conductive layer and the rod member can be good.

Moreover, it is preferable that the conductive layer 19 is made of any one of pyrolytic graphite and pyrolytic graphite containing boron and/or boron carbide. Thereby, the heater can be stably used until a high temperature, and the conductive layer is easier to be processed than metal foil or rolled circuit and therefore it becomes easy that as the heater pattern having meandering pattern, width and thickness thereof are changed and thereby to make a discretionary temperature gradient therein or to make a heating distribution therein according to the heat environment to uniform heat. Furthermore, by using chemical vapor deposition method, the thickness of the conductive layer can be more uniform, compared to a method of coating a conductive paste by screen-printing.

The thickness of the conductive layer 19 is not particularly limited. However, it is desirable that the thickness is 10-300 μm and particularly 30-150 μm. It is sufficient that an appropriate thickness is selected well-considering the relation of the electric capacity or the shape of the heater pattern 20 for making the heater temperature reach an objective temperature and uniform heat.

It is preferable that the formation of the conductive layer 19 is performed so that the rod member 14 and the plate member 12 are integrally coated. Thereby, the rod member and the plate member can be firmly fixed. In particular, by chemically vapor-depositing conductive ceramic material on the whole of the rod member and the plate member, the rod member and the plate member can be firmly fixed easily.

Furthermore, the conductive layer 19 on the surface 16 of the rod member having the same plane and on the main surface 15 of the plate member is processed and thereby the heater pattern 20 is formed. For example, as shown in FIG. 4, it is preferable that as a two-zone system, the heater pattern 20 is formed so that one pair of the rod members can supply current in the pattern forming the first heating region 2 shown as the inner white part and the other pair of the rod members can supply current in the pattern forming the second heating region 3 shown as the outer gray part.

As diameter of a semiconductor wafer has become enlarged in recent years, a large heater has become used as a heater for heating such a wafer. However, because current value and power voltage value are made not to be too large or temperature distribution of the semiconductor wafer is improved, it is preferable that a heater pattern which has two-zone system as described above or which is divided into more regions. However, it is not necessarily limited thereto.

Moreover, it is preferable that by removing partially or totally the conductive layer 19 on the opposite main surface (rear surface) 17 of the plate member 12, the rod members 14 are electrically insulated not to be short-circuited to each other. For example, as shown in FIG. 5 and FIG. 1, by forming a removal part 22 of the conductive layer on the rear surface 17, the electrical insulating can be performed easily.

As described above, the heater being capable of uniform heating with high heating efficiency can be produced by processing the conductive layer 19 on the surface 16 of the rod member and the main surface 15 of the plate member which have the same plane and thereby forming the heater pattern 20 and removing partially or totally the conductive layer 19 on the opposite main surface 17 of the plate member 12 and thereby electrically insulating the rod members 14 not to be short-circuited to each other.

Moreover, it is preferable that the coating layer 21 is made of insulating ceramics formed on the conductive layer 19 and made of any one of pyrolytic boron nitride, pyrolytic boron nitride containing carbon, pyrolytic boron nitride containing silicon, and pyrolytic boron nitride containing aluminum. Thereby, there are no delamination and no scattering of impurities due to use at a high temperature, and therefore, the coating layer becomes applicable to heating process in which high purity is required. For example, it can be also used stably in a high-temperature process at about 1500° C. and additionally at a rapidly rising or falling temperature of 100° C./min or more.

Here, in the case that the coating layer is made of pyrolytic boron nitride containing carbon or pyrolytic boron nitride containing silicon or pyrolytic boron nitride containing aluminum, resistivity of the coating layer becomes smaller as the carbon content or the silicon content or the aluminum content becomes larger. It is necessary that the carbon content or the silicon content or the aluminum content is suppressed to amount by which insulation can be held at gaps of the heater pattern or between the heater pattern and the object to be heated.

The thickness of the coating layer 21 is not particularly limited. However, it is desirable that the thickness is 20-300 μm and particularly 50-200 μm. If the thickness of the coating layer 21 is thicker than 20 μm, there is not a risk of dielectric breakdown or the like, and if the thickness is thinner than 300 μm, delamination or the like is not caused.

Furthermore, by forming the coating layer 21 so that the plate member 12 and the rod member 14 and the conductive layer 19 are integrally coated, the coating layer is being formed by chemical vapor deposition method and at the same time the rod member and the plate member can be easily fixed.

Such a ceramic heater 11 according to the present invention can be produced by a method for producing a ceramic heater, comprising at least steps of:

forming one or more pair(s) of through-holes 13 in a plate member 12 made of insulating ceramics;

forming a power-supply terminal 18 at one end of a rod member made 14 of conductive ceramics and inserting another end thereof into the through-hole 13 of the plate member 12; then forming a conductive layer 19 made of conductive ceramics on the plate member 12; and then forming a coating layer 21 made of insulating ceramics on the conductive layer;

wherein the rod member 14 is inserted into the through-hole 13 of the plate member 12 so that one end face 16 opposite to a side having the power-supply terminal 18 of the rod member 14 has a same plane with a main surface 15 of the plate member; then the conductive layer 19 is formed so that the rod member 14 and the plate member 12 are integrally coated, and thereby to fix firmly the rod member 14 and the plate member 12;

a heater pattern 20 is formed by processing the conductive layer 19 on the main surface 15 of the plate member having the same plane;

the conductive layer 19 on a main surface 17 of the plate member 12 opposite to the main surface on which the heater pattern is formed is partially or totally removed, and thereby to insulate electrically the rod members 14 not to be short-circuited to each other; and then the coating layer 21 is formed so that the plate member 12, the rod member 14, and the conductive layer 19, are integrally coated.

Thereby, a ceramic heater according to the present invention in which the heater main body is not large in size and has a compact structure and by which an object to be heated being directly put on a flat heater can be heated uniformly with high heating efficiency can be easily produced at low cost.

With respect to such a ceramic heater according to the present invention, an object to be heated such as a semiconductor wafer having a large diameter is directly put on the side of the surface in which one end face 16 of the rod member 14 has a same plane with the main surface 15 of the plate member 12 and on which the heater pattern 20 is formed, and electric power is supplied from the power-supply terminal 18, and thereby an object to be heated can be heated uniformly with high heating efficiency although the heater main body is not large in size and has a compact structure.

EXAMPLE

Hereinafter, the present invention will be explained more specifically with reference to Example, however, the present invention is not limited thereto.

Example

First, the plate member made of pyrolytic boron nitride having a diameter of 310 mm and a thickness of 2.5 mm was produced by reacting 4 SLM of ammonium and 2 SLM of boron trichloride under a pressure of 10 Torr at a temperature of 1850° C. The through-holes having a 12 mm diameter were provided in two places on a 102 mm radius from the center of this plate member and in two places on a 111 mm radius therefrom.

Next, after cylindrical rod members (diameter: 12 (mm)+ 0.1-0.2 (mm)) made of graphite (manufactured by Toyo Tanso Co., Ltd., IG-110) were pressed-fit into the through-holes, flat-surface processing was performed so that one end face of each of the rod members had the same plane with the plate member. Moreover, the other end of each of the cylinders was cut at the part of 100 mm from the plate member, and the power-supply terminals were formed by manufacturing M5 screws for connecting conductive wires from a power source.

Next, on the plate member and the rod members formed as described above as shown in FIG. 2 and 3, a pyrolytic graphite layer containing boron carbide having a thickness of 50 μm was provided by pyrolyzing 3 SLM of methane and 0.1 SLM of boron trichloride under a pressure of 5 Torr at a temperature of 1750° C., the heater pattern as FIG. 4 was formed by machining therein, and thereby, this was made to be a ceramic heater having two-zone system.

The first heating region in the central part of the heater and the second heating region located in the outside thereof were divided at the part of a 108.8 mm radius as shown as "A" in FIG. 4. The first heating region had an almost concentric shape and the second heating region had a ring shape.

The pyrolytic graphite layer containing boron carbide formed on the rear surface was partially removed by subjecting only vicinities of the rod members to machining as shown in FIG. 5. Furthermore, on the ceramic heater, the plate member and the rod members and the conductive layer were integrally coated with an insulator film made of pyrolytic boron nitride by reacting 5 SLM of ammonium and 2 SLM of boron trichloride under the condition of a pressure of 10 Torr and a temperature of 1890° C., and thereby, a ceramic heater for heating a semiconductor wafer having a large diameter of 300 mm (12 inches) was completed.

This heater was set to a vacuum chamber and a thermocouple for measuring temperature was attached to the heater and then pressure inside the chamber was depressurized to 5 Pa with a vacuum pump. Then, current was supplied in this heater and a heat cycle examination was performed. With setting the temperature rising rate to 150° C./min and the temperature lowering rate to 100° C./min, rising and lowering of the temperature were repeated between 300-1100° C. by 500 times. As a result, breaking was not caused on the way, and it was possible that the rising and lowering of the temperature by 500 times was performed without problems. After the heat cycle examination, the ceramic heater was gotten out of the vacuum chamber and the appearance thereof was confirmed. Therefore, abnormality in the appearance such as crack or delamination was not observed at all on the insulator film of pyrolytic boron nitride.

As described above, with respect to the ceramic heater according to the present invention, even if it is a heater for heating a semiconductor wafer having a large diameter of 300 mm (12 inches), it is not necessary that the positions in which the rod members are provided are made to be outside the region on the plate member on which a semiconductor wafer is put, and therefore, the heater main body does not become large in size and has a compact structure whose diameter is only about 310 mm. The ceramic heater can heat uniformly an object to be heated with high heating efficiency.

The present invention is not limited to the above-described embodiments. The above-described embodiments are mere examples and those having the substantially same constitution as that described in the appended claims and providing the similar functions and advantages are included in the scope of the present invention.

For example, the case of forming a heater pattern on the same plane made by one end face of the rod member and a main surface of the plate member was described in the above embodiments. However, it is not limited thereto. On the main surface of the plate member opposite to the side on which the heater pattern is formed, another heater patter may be further formed.

What is claimed is:

1. A ceramic heater comprising: at least
   a plate member made of insulating ceramics in which one or more pair(s) of through-holes are formed;
   a rod member, being made of conductive ceramics, having a power-supply terminal at one end thereof, and being inserted into the through-hole of the plate member at another end thereof;
   a conductive layer made of conductive ceramics formed on the plate member; and
   a coating layer made of insulating ceramics formed on the conductive layer;
   wherein one end face opposite to a side having the power-supply terminal of the rod member has a same plane with a main surface of the plate member;
   the conductive layer having a heater pattern is formed on the main surface of the plate member having the same plane; and
   the rod members are electrically insulated not to be short-circuited to each other in a main surface of the plate member opposite to a side on which the heater pattern is formed.

2. The ceramic heater according to claim 1, wherein the rod member is pressed-fit into the through-hole of the plate member and fixed to the plate member by being coated with the conductive layer and the coating layer.

3. The ceramic heater according to claim 1, wherein the plate member is made of any one of pyrolytic boron nitride, pyrolytic boron nitride containing carbon, pyrolytic boron nitride containing silicon, and pyrolytic boron nitride containing aluminum.

4. The ceramic heater according to claim 2, wherein the plate member is made of any one of pyrolytic boron nitride, pyrolytic boron nitride containing carbon, pyrolytic boron nitride containing silicon, and pyrolytic boron nitride containing aluminum.

5. The ceramic heater according to claim 1, wherein the rod member is made of any one of graphite, sintered silicon carbide, and sintered boron carbide.

6. The ceramic heater according to claim 2, wherein the rod member is made of any one of graphite, sintered silicon carbide, and sintered boron carbide.

7. The ceramic heater according to claim 1, wherein the conductive layer is made of any one of pyrolytic graphite and pyrolytic graphite containing boron and/or boron carbide.

8. The ceramic heater according to claim 2, wherein the conductive layer is made of any one of pyrolytic graphite and pyrolytic graphite containing boron and/or boron carbide.

9. The ceramic heater according to claim 1, wherein the coating layer is made of any one of pyrolytic boron nitride, pyrolytic boron nitride containing carbon, pyrolytic boron nitride containing silicon, and pyrolytic boron nitride containing aluminum.

10. The ceramic heater according to claim 2, wherein the coating layer is made of any one of pyrolytic boron nitride, pyrolytic boron nitride containing carbon, pyrolytic boron nitride containing silicon, and pyrolytic boron nitride containing aluminum.

11. A method for producing a ceramic heater, comprising at least steps of:

forming one or more pair(s) of through-holes in a plate member made of insulating ceramics;

forming a power-supply terminal at one end of a rod member made of conductive ceramics and inserting another end thereof into the through-hole of the plate member; then forming a conductive layer made of conductive ceramics on the plate member; and then forming a coating layer made of insulating ceramics on the conductive layer;

wherein the rod member is inserted into the through-hole of the plate member so that one end face opposite to a side having the power-supply terminal of the rod member has a same plane with a main surface of the plate member; then the conductive layer is formed so that the rod member and the plate member are integrally coated, and thereby to fix firmly the rod member and the plate member;

a heater pattern is formed by processing the conductive layer on the main surface of the plate member having the same plane;

the conductive layer on a main surface of the plate member opposite to the main surface on which the heater pattern is formed is partially or totally removed, and thereby to insulate electrically the rod members not to be short-circuited to each other; and then the coating layer is formed so that the plate member, the rod member, and the conductive layer, are integrally coated.

12. The method for producing a ceramic heater according to claim 11, wherein the rod member is inserted into the through-hole of the plate member by press-fit.

13. The method for producing a ceramic heater according to claim 11, wherein as the plate member, any one of, pyrolytic boron nitride, pyrolytic boron nitride containing carbon, pyrolytic boron nitride containing silicon, and pyrolytic boron nitride containing aluminum, is used.

14. The method for producing a ceramic heater according to claim 12, wherein as the plate member, any one of, pyrolytic boron nitride, pyrolytic boron nitride containing carbon, pyrolytic boron nitride containing silicon, and pyrolytic boron nitride containing aluminum, is used.

15. The method for producing a ceramic heater according to claim 11, wherein as the rod member, any one of, graphite, sintered silicon carbide, and sintered boron carbide, is used.

16. The method for producing a ceramic heater according to claim 12, wherein as the rod member, any one of, graphite, sintered silicon carbide, and sintered boron carbide, is used.

17. The method for producing a ceramic heater according to claim 11, wherein the conductive layer is formed by chemically vapor-depositing any one of pyrolytic graphite and pyrolytic graphite containing boron and/or boron carbide.

18. The method for producing a ceramic heater according to claim 12, wherein the conductive layer is formed by chemically vapor-depositing any one of pyrolytic graphite and pyrolytic graphite containing boron and/or boron carbide.

19. The method for producing a ceramic heater according to claim 11, wherein the coating layer is formed by chemically vapor-depositing any one of pyrolytic boron nitride, pyrolytic boron nitride containing carbon, pyrolytic boron nitride containing silicon, and pyrolytic boron nitride containing aluminum.

20. The method for producing a ceramic heater according to claim 12, wherein the coating layer is formed by chemically vapor-depositing any one of pyrolytic boron nitride, pyrolytic boron nitride containing carbon, pyrolytic boron nitride containing silicon, and pyrolytic boron nitride containing aluminum.

* * * * *